United States Patent [19]

Baglin et al.

[11] 4,001,049
[45] Jan. 4, 1977

[54] METHOD FOR IMPROVING DIELECTRIC BREAKDOWN STRENGTH OF INSULATING-GLASSY-MATERIAL LAYER OF A DEVICE INCLUDING ION IMPLANTATION THEREIN

[75] Inventors: John E. Baglin, Mohegan Lake; Thomas H. DiStefano, Tarrytown; King-Ning Tu, Mahopac, all of N.Y.

[73] Assignee: International Business Machines Corporation, Armonk, N.Y.

[22] Filed: June 11, 1975

[21] Appl. No.: 585,924

[52] U.S. Cl. ............................................. 148/1.5
[51] Int. Cl.² ...................................... H01L 21/265
[58] Field of Search ..................... 148/1.5; 117/200

[56] References Cited
UNITED STATES PATENTS

| | | | |
|---|---|---|---|
| 3,472,751 | 10/1969 | King | 148/1.5 UX |
| 3,540,925 | 11/1970 | Athanas et al. | 148/1.5 X |
| 3,657,542 | 4/1972 | Futch et al. | 148/1.5 UX |
| 3,852,120 | 12/1974 | Johnson et al. | 148/1.5 |
| 3,862,930 | 1/1975 | Hughes | 148/1.5 X |

*Primary Examiner*—L. Dewayne Rutledge
*Assistant Examiner*—J. M. Davis
*Attorney, Agent, or Firm*—Bernard N. Wiener

[57] ABSTRACT

It has been discovered for the practice of this disclosure that a particular ion radiation treatment of amorphous $SiO_2$ thin film, with a subsequent annealing procedure, improves the dielectric breakdown property of the film. The treated $SiO_2$ film is found to be substantially more dense than a comparable untreated $SiO_2$ film. It is theorized for the practice of this disclosure that the physical mechanism which produces the densification of the $SiO_2$ film may be responsible for the enhanced dielectric properties of the film. Such an improved film is especially useful as the gate insulator layer in an insulated-gate electrode field-effect transistor device, and as an insulating layer for electrically separating two metallic films in a thin film integrated circuit. Such $SiO_2$ thin films are useful in integrated circuit technology because the electrical insulation property thereof is considerably improved, e.g., in metal-oxide-semiconductor field effect devices in which the gate insulation is relatively thin, e.g. less than 500A, and in metallic magnetic-bubble devices in which a thin $SiO_2$ layer is used to separate the sense element from the conductive magnetic film.

7 Claims, 20 Drawing Figures

ION ENERGIES $E_1 > E_2 > E_3 > E_4 > \text{------} E_n$

METHOD FOR IMPROVING DIELECTRIC BREAKDOWN STRENGTH OF INSULATING-GLASSY-MATERIAL LAYER OF A DEVICE INCLUDING ION IMPLANTATION THEREIN

BACKGROUND OF THE INVENTION

Heretofore, ion implantation has been utilized for several beneficial purposes in connection with semiconductor devices. Illustratively, He ions have been implanted through an insulator layer of $SiO_2$ to an interface with a Si substrate for neutralizing undesirable charge states at the interface. Further, He ions have been implanted into a layer of $SiO_2$ adjacent a semiconductor body to neutralize free Na ions in the $SiO_2$ layer which are detrimental to the operation of the semiconductor device.

Contrary to the premise of this invention, it has been reported in the literature that the implantation of ions into a thin insulator film decreases the dielectric breakdown strength of the film. It is theorized for understanding the premise of this invention that the noted decrease in dielectric breakdown strength reported in the literature may have occurred for one or more of the following reasons: the implanted ions were electron traps in the dielectric insulator; the implantation partially decomposed the lattice of the insulator; and the implantation degraded the relatively smooth interface between the insulator and its electrical contacts thereon.

It has been discovered, for the practice of this invention, that the implanting of specific ions into a film of amorphous $SiO_2$ insulation at a particular energy and dosage, in conjunction with an annealing treatment of the film, improves the dielectric breakdown strength of the film.

OBJECTS OF THE INVENTION

It is an object of this invention to provide a method for improving the dielectric breakdown strength of a film of amorphous $SiO_2$ in a microelectronic configuration wherein said film is operable as a dielectric medium for electric field sustaining purpose.

It is another object of this invention to achieve the immediately aforesaid object by a method which includes the steps of irradiating the film with selected ions of particular energies and of annealing the film contemporaneously with or subsequent to the absorption of the radiation ions.

It is another object of this invention to provide an electrical circuit device with a film of $SiO_2$ therein which has a selected dielectric breakdown strength for electric field sustaining purpose.

It is another object of this invention to practice the immediately aforesaid object by irradiating selectively said film with particular ions selected from the group of hydrogen, argon, xenon, krypton, neon and helium and with energies to penetrate said film and be absorbed therein and by annealing said film selectively.

It is another object of this invention to establish selectively the dielectric breakdown strength of an insulation layer of a device for an electrical circuit by a method which includes implanting ions therein having ionization energy of greater than the electronic bandgap of the insulator layer.

SUMMARY OF THE INVENTION

It has been discovered for the practice of this invention that irradiation of amorphous $SiO_2$ thin film with particular ions of selected energies both improves the dielectric breakdown strength thereof and achieves densification thereof.

Thin films of $SiO_2$, e.g., which are less than about 10,000 A thick, may have an actual extrinsic dielectric breakdown strength which is considerably below the theoretical intrinsic value, which may be due to "pinholes" or "micropores" in the $SiO_2$ thin film. Ion radiation according to the principles of this invention improves the dielectric breakdown strength of $SiO_2$ thin films with concomitant densification. The resulting densified $SiO_2$ films have a statistical breakdown strength distribution which is substantially improved over that of the undensified $SiO_2$ films.

$SiO_2$ thin films which are irradiated with ions in accordance with the principles of this invention are especially useful in an integrated circuit, e.g., a thin layer of $SiO_2$ insulation in an electric field path can be considerably improved by the technique. Illustratively, practice of the invention is applicable to the metal-oxide-semiconductor devices in which the gate insulation is quite thin, e.g., less than 500 A, and which normally contains a high density of pinholes.

Ions for the practice of this invention include the inert gases such as helium, neon, argon, krypton and xenon and the element hydrogen.

Ion fluences for the practice of this invention are chosen sufficient to densify significantly that part of insulator material whose dielectric breakdown strength is to be improved. Ion energies are chosen so that no significant portion of the ions have ranges which extend to or beyond the insulator-substrate interface. Ion fluxes (ions per $cm^2$ per second) are kept low enough to preclude the possibility of a catastrophic (spark) breakdown of the layer, which could be induced by charge deposited within the insulator by the ion beam. The use of a neutralized beam would enable this condition to be satisfied by a much larger ion flux than a normally un-neutralized beam would allow.

This invention provides a method for improving the dielectric property of a thin $SiO_2$ layer by use of relatively small dosage of the implanted ions. Illustratively, ions of He of energy of a few KeV with a dose or fluence in the region of approximately $10^{15}$ ions/$cm^2$ can be used. It takes a relatively short time, e.g., less than about 15 minutes, to improve significantly the dielectric breakdown strength of a thin film of $SiO_2$ of 1 inch diameter. It has been discovered for the practice of this invention that after the ion beam bombardment, annealing of the $SiO_2$ film at about 500° C for approximately 1 hour is desirable to achieve the improved dielectric breakdown strength. It is theorized for the practice of this invention that the noted annealing treatment of the film after ion implantation removes undesirable electric charge in the layer which has been introduced thereby. Generally, the annealing time and temperature are chosen so as to remove substantially electric charge introduced by the energetic ions. For amorphous $SiO_2$, the suitable temperature range for such annealing is between 200° C and 800° C.

There has been obtained data for the practice of this invention for comparison of the dielectric breakdown strengths of several 200A thickness $siO_2$ layers on several Si wafers with and without an ion beam radiation treatment according to the principles of this invention on adjacent delineated portions of the same wafer. It was demonstrated that a substantial improvement of dielectric breakdown strength was obtained for those portions of the $SiO_2$ film which were treated with an ion beam in accordance with the principles of this invention.

BRIEF DESCRIPTION OF THE DRAWINGS

FIG. 2 illustrates energetic ions being introduced into a layer of $SiO_2$ thin film for an electric circuit device wherein it is to be established between a metal layer and another metal layer or a semiconductor layer, in which:

FIG. 3 illustrates the practice of this invention for a magnetic bubble domain device environment in which:

FIGS. 5B and 5B2 show the voltage and current versus time electrical characteristics, respectively, from the measurements of the electrical dielectric breakdown strength through the set up illustrated by FIG. 5A.

FIGS. 6A, 6B and 6C are graphical representations which illustrate how ion beam energy is deposited in atomic recoils as a function of the depth below the film surface in which:

FIGS. 7A and 7B illustrate the behavior of the physical compaction of a film of $SiO_2$ due to various types of ions in which:

DESCRIPTION OF THE DRAWINGS

Figure 1:
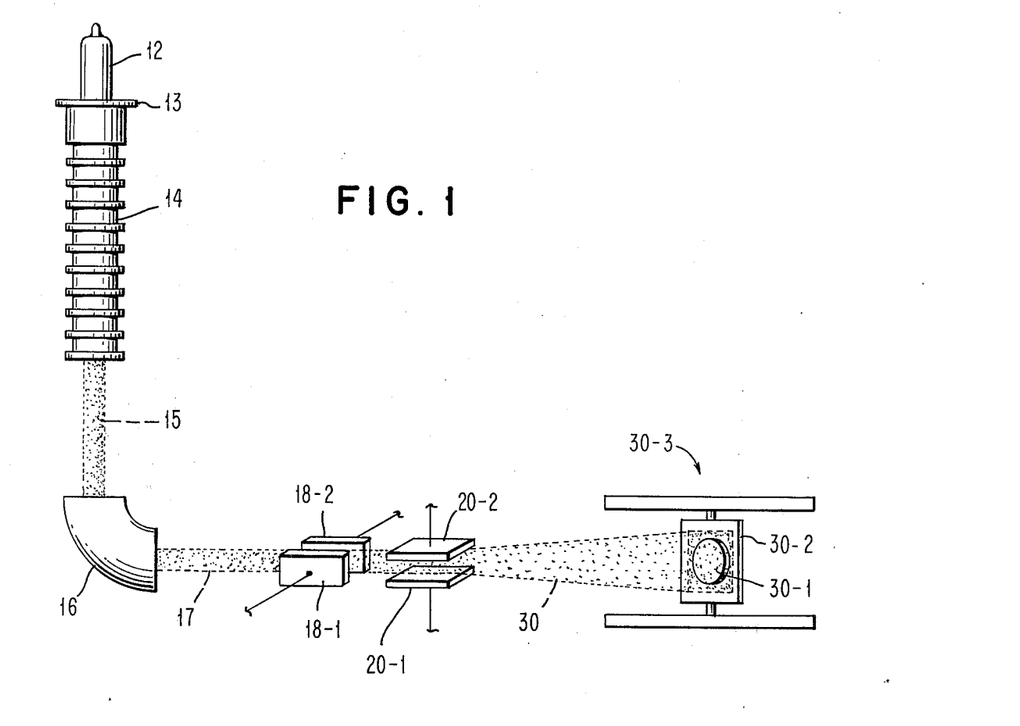
FIG. 1 illustrates in schematic form an ion-accelerator apparatus suitable for achieving ion implantation in an insulation layer in accordance with the principles of this invention.

FIG. 1 is an illustration in schematic form of one exemplary apparatus suitable for ion implantation in an insulator layer in accordance with the principles of this invention. The basic elements of the apparatus include an ion source 12 mounted on the end 13 of an accelerator unit 14. Ions emerge from the accelerator tube 14 and pass through a momentum analyzing magnet 16. The ion beam 17 which emerges from the analyzing magnet 16 passes through an ion deflection system which comprises beam scanner plates 18-1 and 18-2. The ion beam 30 emerges from the beam scanner plates and is directed upon the material 30-1 to be densified. Material 30-1 is mounted on plate 30-2 which is constrained by mount 30-3. Ion energy, ion flux, integrated beam flux and energy spread all should be closely controlled.

Figure 2A:
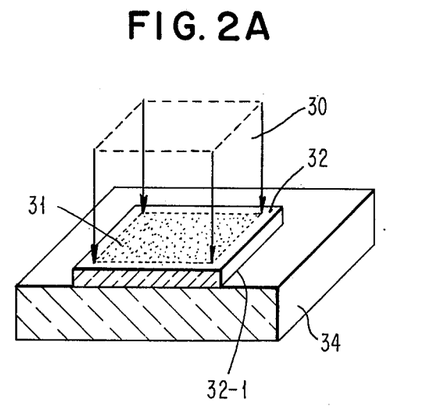
FIG. 2A illustrates irradiation of the thin film of $SiO_2$.
Figure 2B:
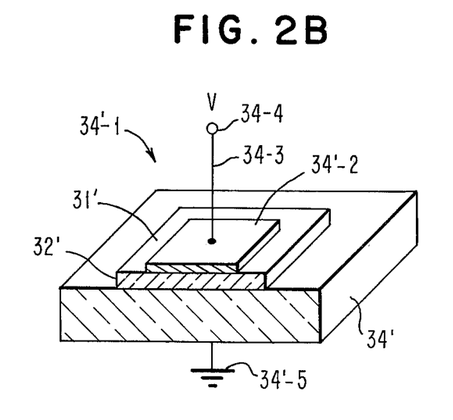
FIG. 2B illustrates the complete device.

FIGS. 2A and 2B illustrate the introduction of energetic ions into a layer of $SiO_2$ thin film for an electrical circuit device wherein it is established between a metal layer and another metal layer or a semiconductor layer. FIG. 2A illustrates irradiation of thin film of $SiO_2$ with ions which have penetration depths therein which are less than the thickness of the film. FIG. 2B illustrates the complete device.

In FIG. 2A, the ion beam 30 is incident on the upper face 31 of $SiO_2$ thin film 32 which is supported by substrate 34. The energy of the ion beam is chosen to ensure that the ions do not penetrate significantly below the lower surface 32-1 of the $SiO_2$ layer 32 so that the ions affect only the $SiO_2$ thin film 32 and not the substrate 34 or the material of the interface. Substrate 34 is either metallic or a semiconductor. The $SiO_2$ thin film 32 of FIGS. 2A and 2B may be established on substrate 34 by one or more conventional techniques such as: chemical vapor deposition, evaporation and sputtering.

The completed device 34-1 which includes densified $SiO_2$ film 32' is shown in FIG. 2B. Metallic electrode 34'-2 is established in contact with the upper face 31' of film 32'. Conductor 34'-3 is affixed to electrode 34'-2 and is otherwise connected to terminal 34-4 to which a voltage V is applied. Substrate 34 is connected to the ground potential 34'-5. Accordingly, device 34'-1 has improved electrical property because densified film 32' is used therefor rather than original film 32.

Figure 3A:
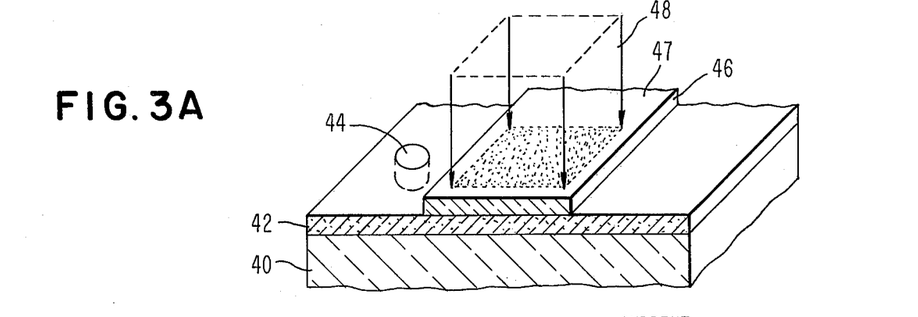
FIG. 3A shows the device prior to the establishing of the control sensor strip.
Figure 3B:
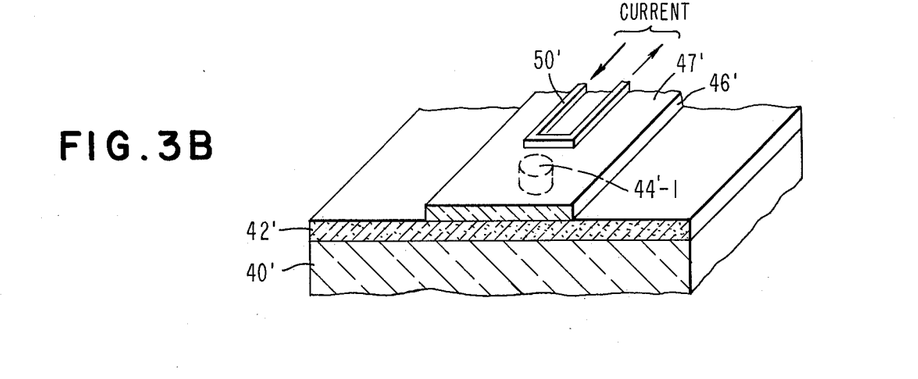
FIG. 3B shows the device completed with the control sensor strip after the $SiO_2$ thin film insulator has been implanted with ions in accordance with the principles of this invention.

The practice of this invention as applied for improving $SiO_2$ thin film insulator layers in magnetic bubble domain technology is exemplified by FIGS. 3A and 3B wherein: FIG. 3A shows the device prior to the establishing of the control sensor strip; and FIG. 3B shows the device completed with the control sensor strip after the $SiO_2$ thin film insulator has been implanted with ions in accordance with the principles of this invention. An appropriate substrate 40, e.g., has established thereon a magnetic thin film 42 which is capable of sustaining magnetic bubbles, one of which is characterized as magnetic bubble 44. A thin film 46 of SiO₂ is established on magnetic thin film 42 at interface which is irradiated at its upper surface 46-1 by ion beam 48. After ion implantation in and the improvement of the dielectric property of the thin film 46, the appropriate sensor strip of permalloy 50 is established on the upper face 47' of the densified SiO₂ thin film insulator 46'. For illustrative purpose in FIG. 3B, an operational magnetic bubble 44'-1 is shown in position under film 46' to be sensed by the sensor strip 50.

Figure 4A:
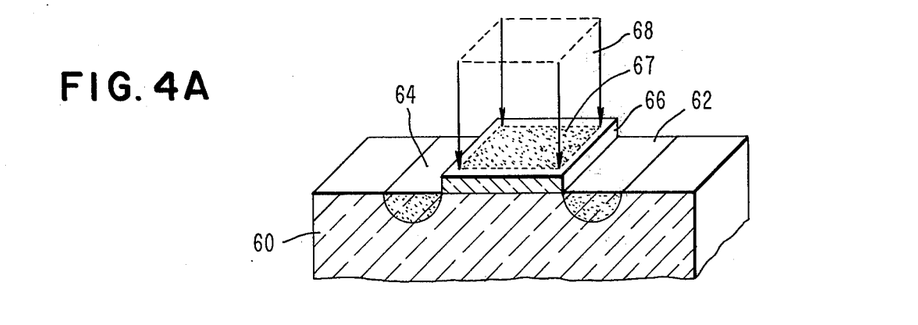
FIGS. 4A and 4B illustrate the before and after conditions, respectively, for a semiconductor field effect transistor device whereby the thin film gate insulator thereat is improved in dielectric breakdown strength property for the operational device.
Figure 4B:
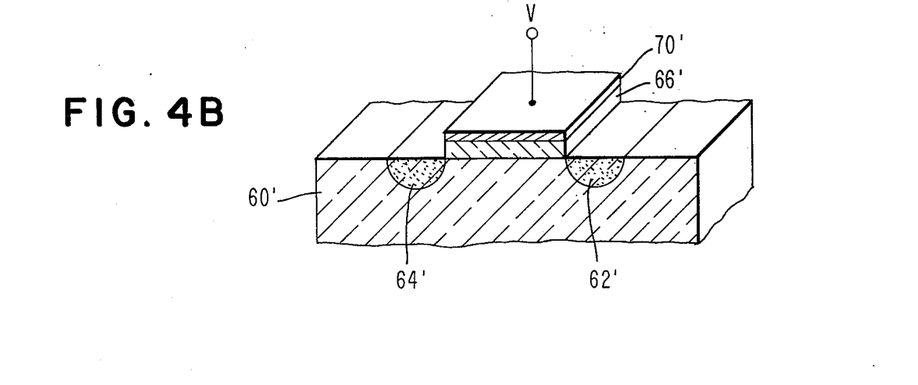

The application of the principle of this invention for improving solid-state devices based upon silicon integrated circuit technology is illustrated in FIGS. 4A and 4B wherein: FIGS. 4A and 4B illustrate the before and after conditions, respectively, for a semiconductor field effect transistor device whereby the thin film gate insulator is improved in dielectric breakdown strength property for the operational device. There are established in the silicon substrate 60 source region 62 and drain region 64 by conventional diffusion technique. The original gate insulator of SiO₂ thin film 66 is established proximate to the source and drain regions and is irradiated by ion beam 68 in accordance with the principles of this invention. Subsequently, the gate electrode 70' is established on the upper surface 67' of the silicon dioxide thin film layer 66' to complete a field effect transistor with an improved dielectric gate region in accordance with the principles of this invention.

Figure 5A:
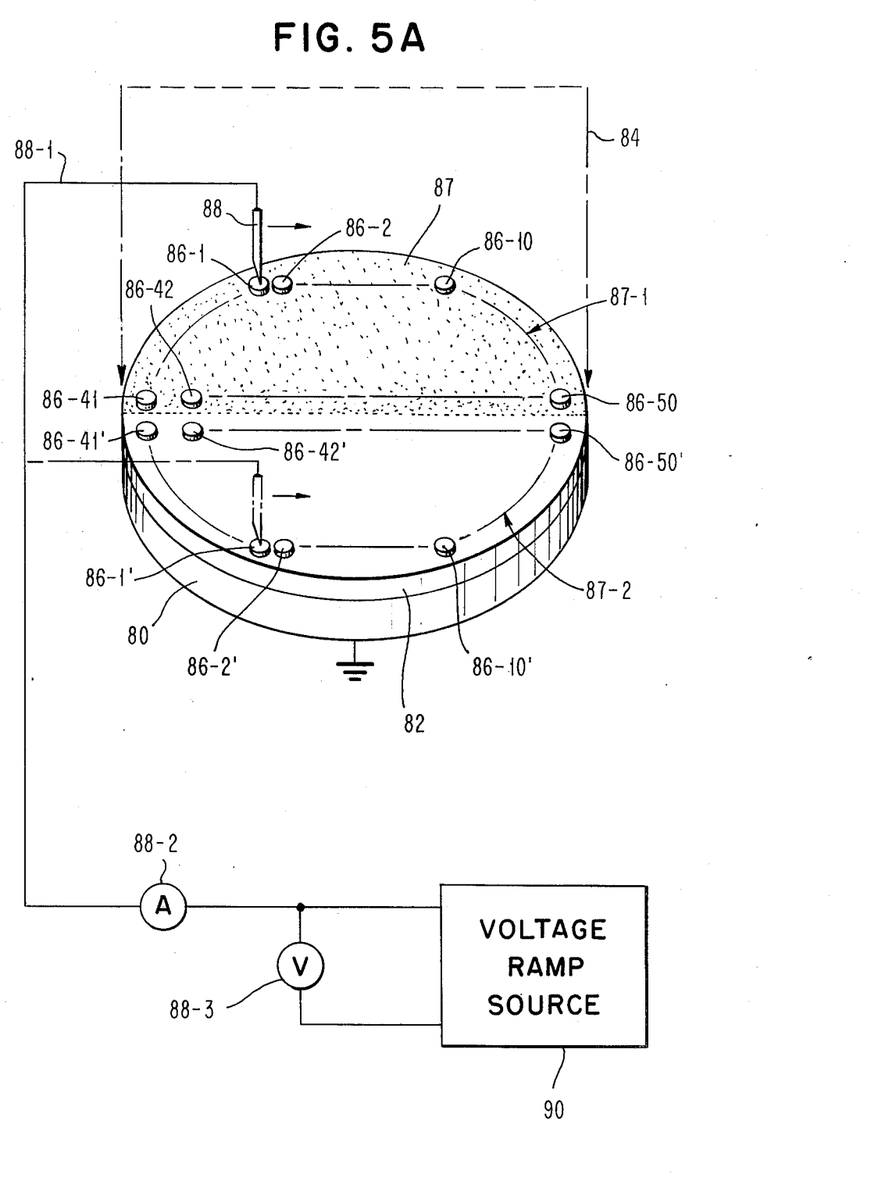
FIG. 5A illustrates the setup for obtaining data wherein approximately one half of a layer of $SiO_2$ is irradiated with ions of selected energies and the other half of the layer is not so irradiated for comparison of the change in dielectric breakdown strength resulting from the irradiation.
Figure 5B:
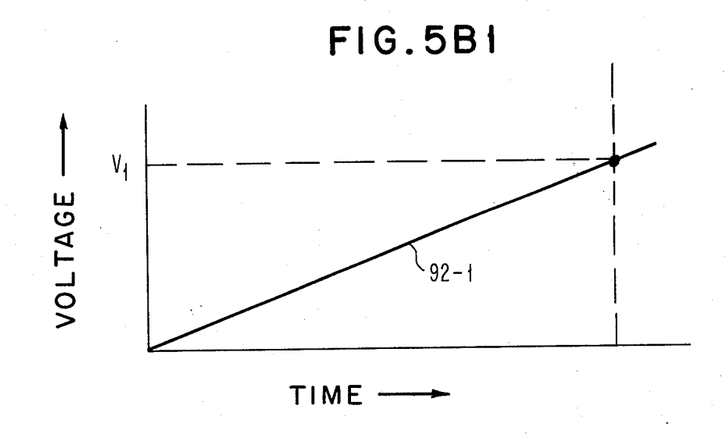
Figure 5B:
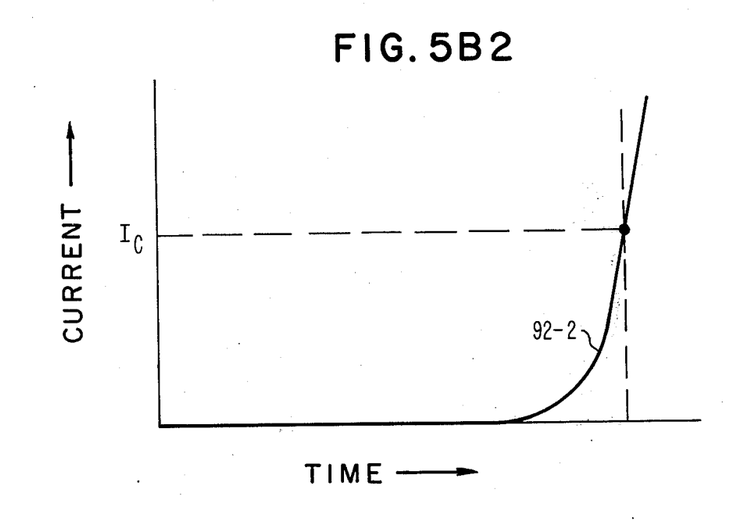

FIG. 5A illustrates the setup for obtaining data wherein approximately one half of a layer of SiO₂ is irradiated with ions of selected energies and the other half of the layer is not so irradiated for comparison of he change in dieletric breakdownstrength resulting from the irradiation; FIGS. 5B1 and 5B2 show the voltage and current versus time electrical characteristics, respectively, from the measurements of the electrical dielectric breakdown strength through the set up illustrated by FIG. 5A.

In greater detail FIG. 5A shows an exemplary wafer 80 of silicon with a layer 82 of silicon dioxide thereon, one half of which is shown as irradiated by an ion beam 84. A set of discrete electrodes 86-1 to 86-50 is established on the surface 87 at the area to be irradiated and another set of discrete electrodes 86'-1 to 86'-50 is established at the area 87'-1 which is not irradiated. A rampvoltage from ramp voltage source 90 obtains the test dielectric breakdown voltage.

FIGS. 5B1 and 5B2 show the electrical characteristics for the breakdown of the thin film82 of FIG. 5A. The voltagecurve 92 is shown on the graph of FIG. 5B1 with the voltage scale being vertical and time being horizontal. When the current 93 sharply rises to a critical value as shown in FIG. 5B2, there is a breakdown in the thin film of SiO₂ at the location of the given electrode which is carefully monitored and the data recorded for the histogram of FIG. 5C.

Probe 88 is connected by conductor 88-1 via ammeter 88-2 to voltage ramp generator 90. Voltmeter V provides the measure of the voltage applied across insulation layer 82 via the respective electrodes. Data is obtained for the dielectric breakdown voltage of each of the discrete electrodes.

In particular, the dielectric strength of radiation densified SiO₂ had been measured for thin films for which there had been implantation of low energy He ions therein. A subsequent annealing treatment presumably removed substantially any radiation damage. Illustratively, the dielectric breakdown strength of a 200A film and its density were increased.

Thin film SiO₂ examples were prepared by thermally oxidizing the (100) surface of 2 ohm-cm n-type silicon wafers in dry oxygen at 1000° C. One half of each silicon wafer was densified by a dose or fluence of $10^{16}$ He⁺/cm² of energy 50 KeV. The examples were annealed for 1 hour in dye helium at 450° C after the ion implantation. The purpose was to remove any radiation damage. Fifty aluminum electrodes of 0.016 inch in diameter and 5000A thickness were evaporated at room temperature onto each one half of the annealed examples. The breakdown voltage was measured at each electrode on each half of the example by applying a voltage ramp to the electrode at rate of 0.01 volts/sec. and sensing the voltage at which the current exceeded $10^{-4}$ amperes. Data taken at electrodes which exhibited an initial ohmic contact were not considered in the final results because this defined an unacceptable electrode for measurement of the effect of ion implantation.

Figure 5C:
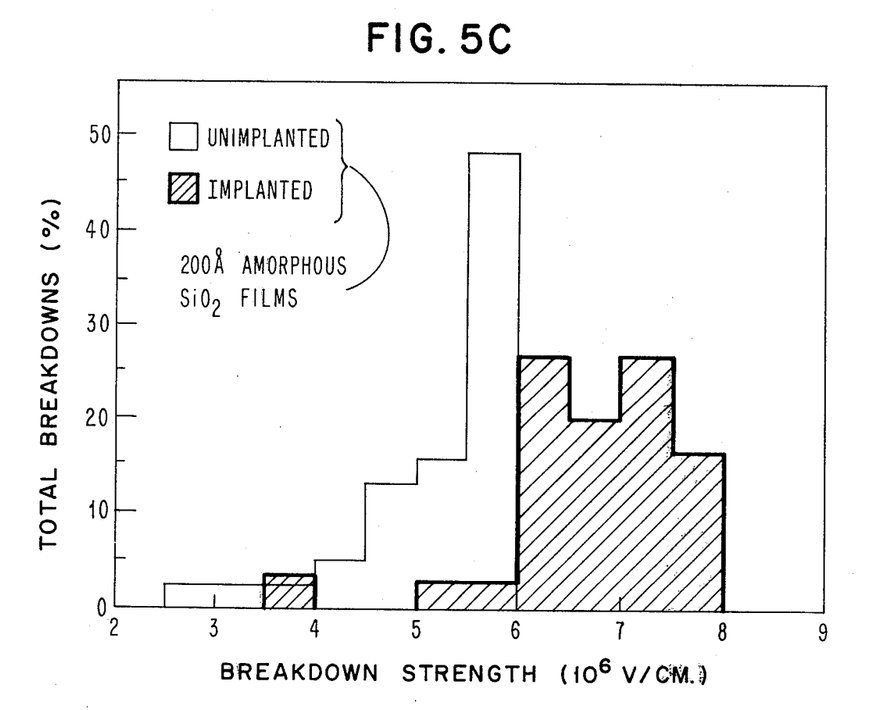
FIG. 5C presents a histogram of the distribution of breakdown voltages of several examples of 200 Angstrom thick $SiO_2$ film of which portions were ion implanted and portions were not.

FIG. 5C shows the distribution of breakdown voltage for several examples. There was an average breakdown field of $6.7 \times 10^6$ V/cm for the one half of the example which had not been irradiated. In addition, there was a reduction of the number of breakdown events, which occurred at relatively low voltages in the ion implanted half of the sample. Thus, both the average dielectric breakdown strength and the spread of breakdown which occur at low fields were improved by the irradiation treatment of the SiO₂ film.

Figure 6A:
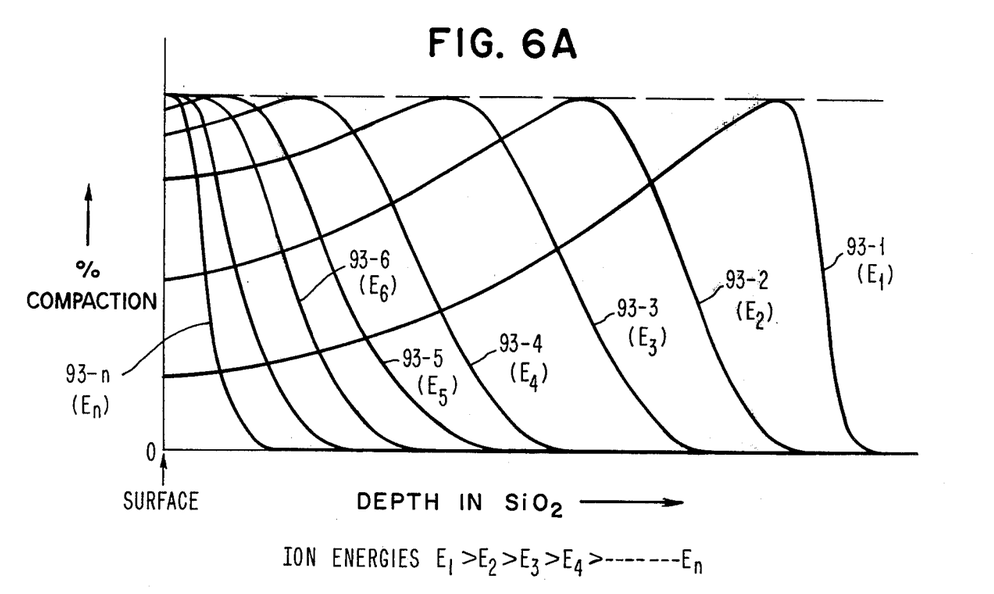
FIG. 6A shows how ions of different energies compact successively deeper layers of $SiO_2$ as the ion energy is raised.
Figure 6B:
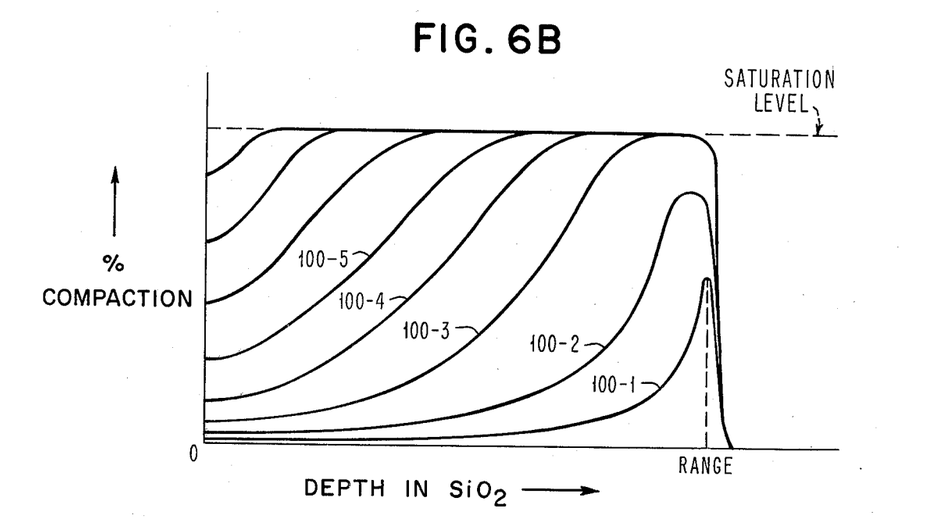
FIGS. 6B and 6C illustrate another way to reach saturation compaction in a film by using a large beam dose at a single energy of ions chosen so that almost the entire ion range eventually reaches saturation compaction.
Figure 6C:
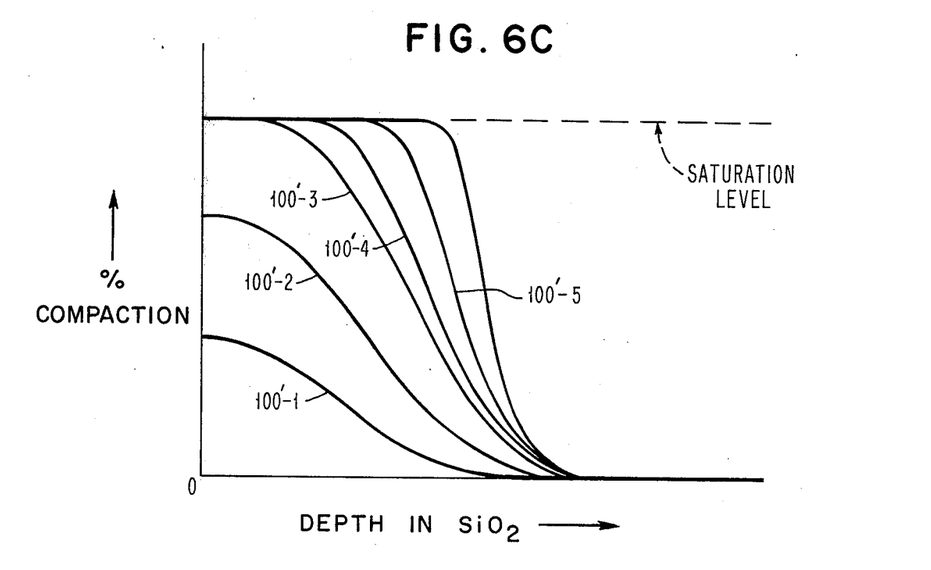

FIGS. 6A, 6B and 6C are graphical representations of curves which illustrate how energy of incident ions is deposited in atomic recoils as a function of the depth below the film surface according to theoretical considerations.

In greater detail, FIG. 6A shows how ions of different energies will compact successively deeper layers of SiO₂ as the ion energy is raised. The energy chosen for the optimal practice of this invention will be that which compacts as much as possible of the SiO₂ film without significant ion penetration into the substrate. By increasing the ion energy steadily, there is produced a compaction distribution equivalent to an integral sum of curves such as those shown in FIG. 6A each of which obtains the saturation level of compaction. FIGS. 6B and 6C illustrate another way to reach saturation compaction in a film. A large beam dose at a single energy of ions is applied so that almost the entire ion range eventually reaches saturation compaction.

In greater detail, FIG. 6A presents a graphical illustration of the compaction or densification of a film of SiO₂ in accordance with the principles of this invention for ions of a given energy. The vertical axis is percent compaction and the horizontal axis is the depth in the film at which the ion gives up its energy. FIG. 6A illustrates how a significant depth of compaction in a film can be achieved by ions of different ion-energies $E_1$, $E_2$ ... $E_n$, where $E_1 > E_2 > ... E_n$. The contribution to the compaction of the film by the highest energy ions is curve 93-1, assuming that just sufficient dose or fluence has been given to approach saturation at the corresponding range of the highest energy ions. By using a beam of lowest energy 93-1 and adding in the saturation fluence of these ions with compaction related to curves 93-2 to 93-6 and continuing via comparable curves until the material surface is reached, relatively efficient and uniform compaction or densification in the film can be achieved from the maximum ion range chosen to the surface.

FIG. 6B shows how maximum compaction can be achieved by successively increasing the fluence of ions of a single high energy ion beam. The series of curves 100-1, 100-2, 100-3 et seq. are for a sequence of successive ion fluences starting with a small fluence at 100-1 at which there is no saturation. Curve 100-2 is for almost twice the fluence of curve 100-1 with almost twice the percent of compaction. Curve 100-3 shows the saturation compaction at the range depth of the ion. 100-4 shows what happens when more incoming ions are added. No significant further compaction can occur at the saturated portion. However, more compaction occurs at regions closer and closer to the surface of the $SiO_2$. Curve 100-5 illustrates that even further compaction begins to occur closer to the surface of the film. By continuing the ion bombardment, saturation compaction gradually proceeds to the surface.

The integrated compaction for FIG. 6A would be the same saturation level as for the case of FIG. 6B. Experimentally, this has been found to be approximately in the range of 3.5% to 5.5% increase in local density. Where $SiO_2$ films are very thin, and hence low energy heavy ions are used, the compaction of the film will approximate a maximum value of about 5.5%.

FIG. 6C shows a corresponding sequence of curves to those shown in FIG. 6B for ions of large mass or low energy.

Figure 7A:
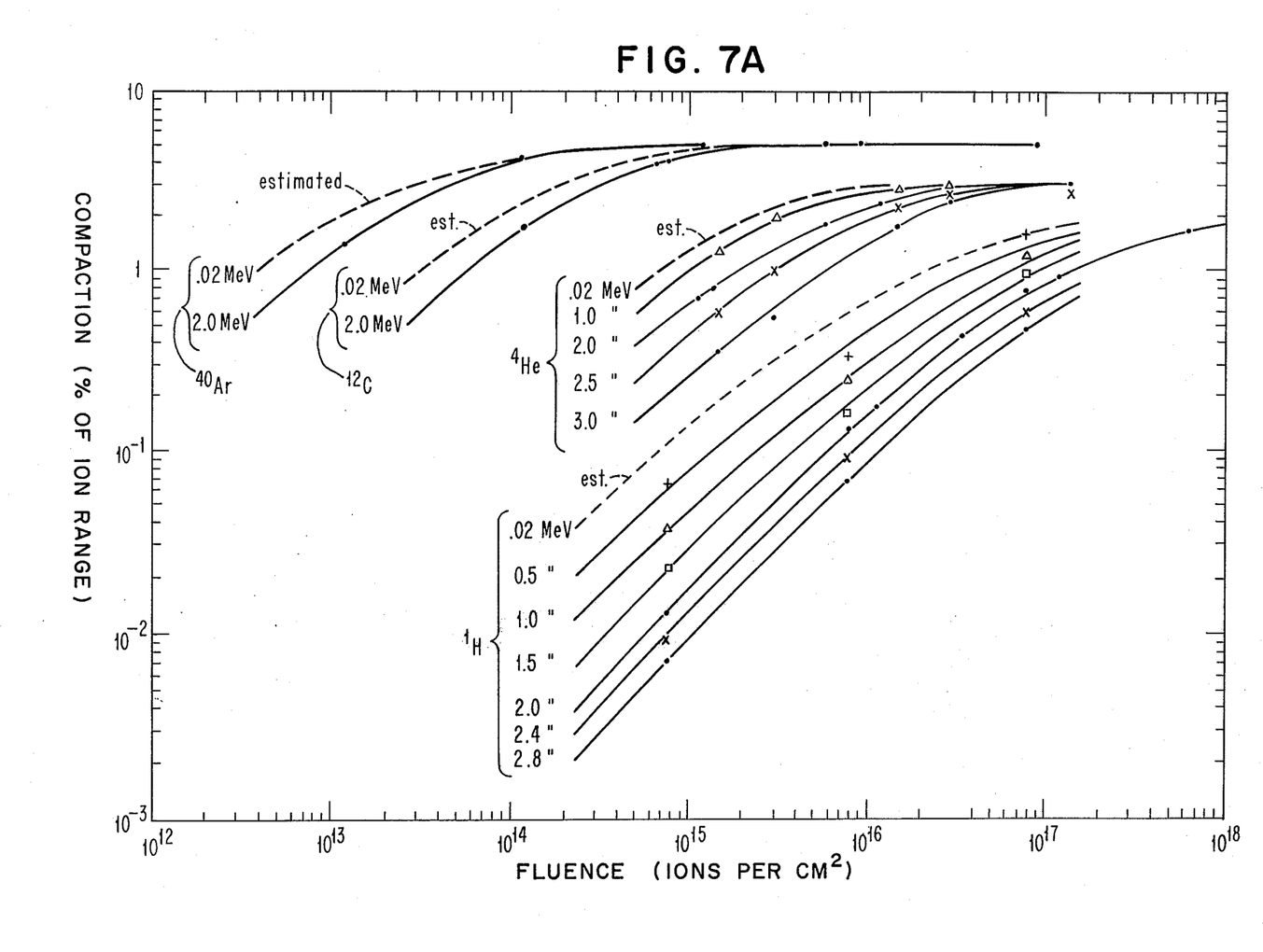
FIG. 7A illustrates the circumstance for ions with different energies in a given species.
Figure 7B:
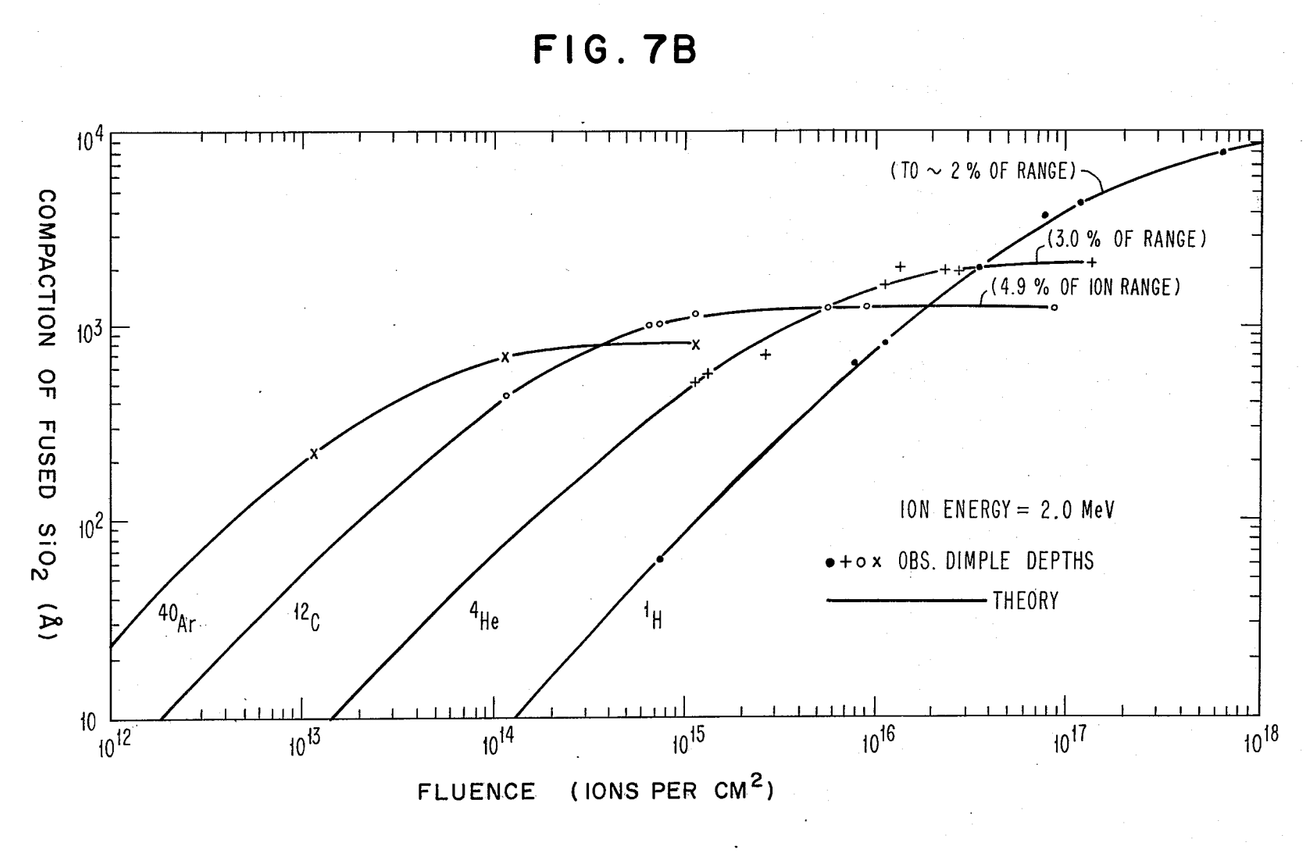
FIG. 7B illustrates compaction for beams of several representative ions having ion energy of 2 MeV.

FIGS. 7A and 7B illustrate the behavior of the compaction in percent of the ion range of a film of $SiO_2$ due to various types of ions. FIG. 7A illustrates the circumstance for ions with different energies in a given species; and FIG. 7B illustrates compaction for beams of several representative ions having ion energy of 2 MeV. The solid curves illustrate the high ion energy compaction. Extrapolation to the dashed estimated areas for low energies used for thin $SiO_2$ films is considered to be valid for the practice of this invention.

CONSIDERATIONS FOR THE INVENTION

Figure 8A:
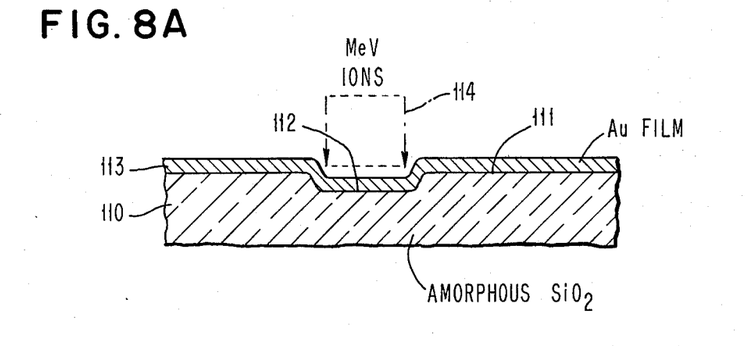
FIG. 8A is a cross-sectional view of an $SiO_2$ film with a layer thereon after a depression has been created in the surface by ion beam compaction.

FIG. 8A is a cross-section view which shows a fused quartz (amorphous $SiO_2$) example 110 after compaction in surface 111 at a 1 mm × 2 mm depression 112 by ion beam 114. The depression 112 was produced by 2 MeV $^4He^+$ ions 114 at dosage or fluence of $10^{15}$ ion/cm². The Au metallic film 113 was vapor deposited prior to irradiation of the composite and was used to bring out the contrast of the depression 112 from the surface 111. The depression is caused by compaction of $SiO_2$ and not by sputtering of the Au (which is seen to remain intact).

Alternatively, a Cr film of 200A thickness was deposited onto the surface of a fused quartz wafer prior to irradiation. Thereafter, nuclear backscattering measurements were made of the Cr layer before and after the compaction. The Cr counts did not change, which shows that the depression is not due to sputtering of the Cr.

Figure 8B:
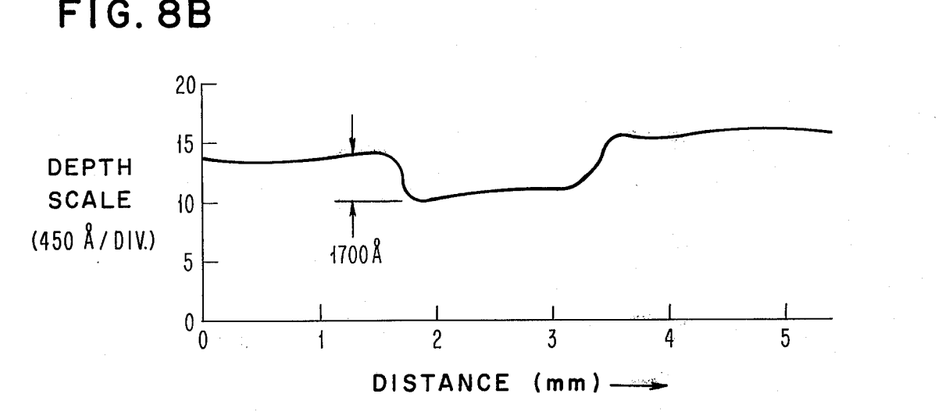
FIGS. 8B and 8C are plots of the depth of the compaction below the original surface of the compacted film of FIG. 8A as measured by a mechanical depth gauge on the Au layer and on the surface of the $SiO_2$ after the Au layer was removed.
Figure 8C:
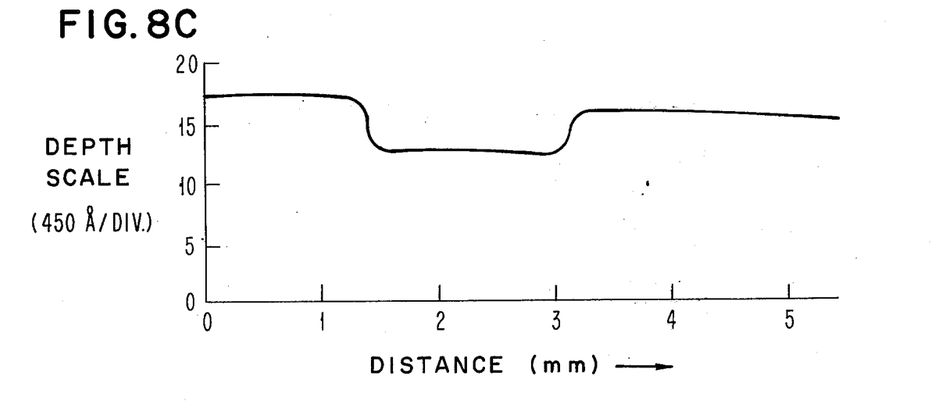

Au films 113 which had poor adhesion to glass surfaces were pulled off the respective substrates and the depressions 112 were measured directly in the glass surface by a depth gauge. FIGS. 8B and 8C show the contours respectively of an Au film surface and of a fused quartz surface after the Au film was pulled off. Because the surface contours are substantially identical, the formation of a depression is by the collapse of the irradiated amorphous $SiO_2$ to a depth of about 1700A. The penetration of the ions in the fused quartz is estimated to be in the range of about above 4 microns. Therefore, the the glass has undergone a volume shrinkage of the order of a few percent.

Ellipsometry was used to measure the compaction of thermally-grown $SiO_2$ films of about 4000A thickness. Ellipsometry is an optical measurement of the extent that an optical reflecting surface rotates polarization plane of light. Here, it provides an indication of the $SiO_2$ layer thickness. The change in thickness is too small to be determined by mechanical depth gauge. The He ion beam was 50 KeV so that the ions did not traverse the oxide to the Si—$SiO_2$ interface at the Si substrate. Table I shows exemplary results of densification of $SiO_2$ films by 50 KeV $^4He^+$ ions at a dose or fluence of $2 \times 10^{16}$ ions/cm². The table also contains ellipsometry measurements of thickness and index of refraction of the oxide films before the implantation. A density increase of about 1% of the oxide was measured for the change in the film thickness, and the refractive index of the oxide film was found to increase by about 2%.

TABLE I

Densification Of Thermally-Grown $SiO_2$ By Implantation Of 50 KeV Helium At $2 \times 10^{16}$ Ions/CM²

| | Wafter No. | Thickness of $SiO_2$ | Difference in Thickness After Implantation | Index of Refraction |
|---|---|---|---|---|
| Before Implantation | 4 | 3,820Å | | 1.464 |
| | 5 | 3,749Å | | 1.465 |
| After Implantation | 4 | 3,779Å | —41Å | 1.4907 |
| | 5 | 3,712Å | —37Å | 1.4901 |

Figure 8D:
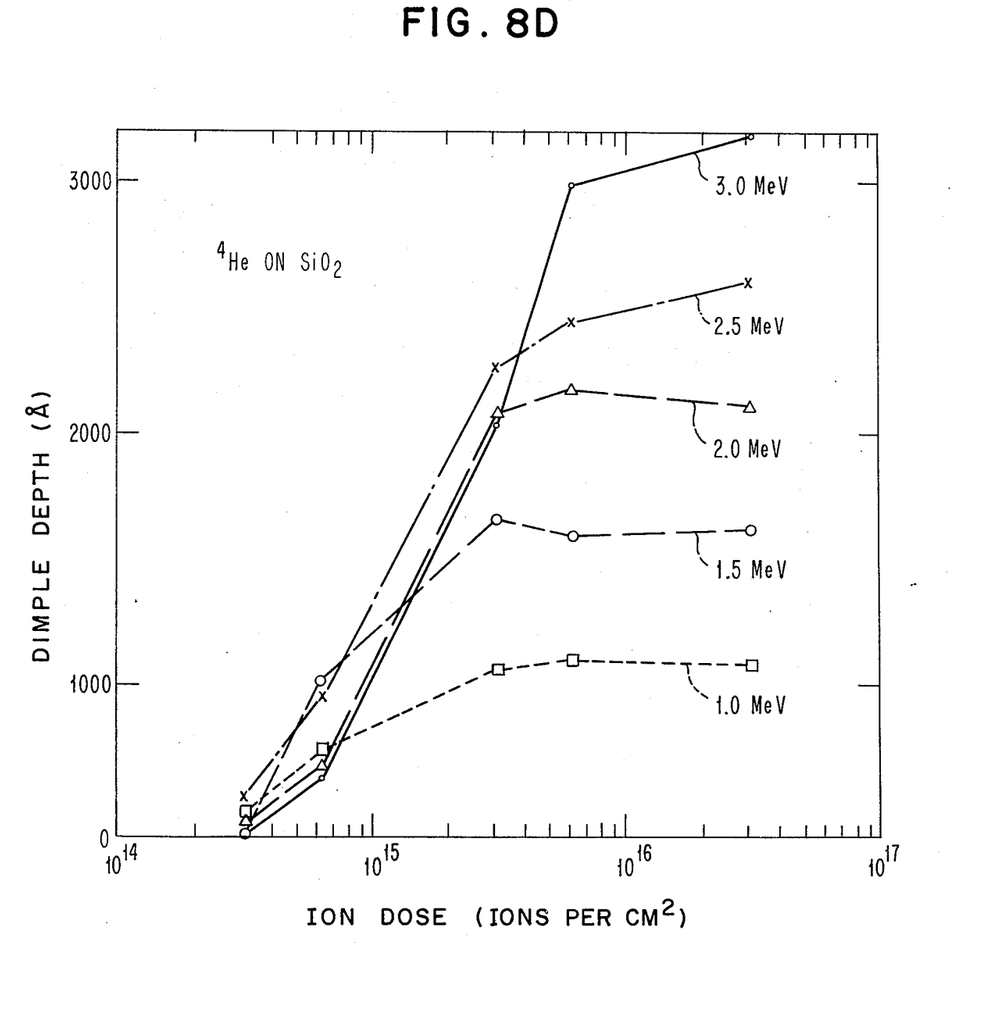
FIG. 8D shows plots of data of the compaction of amorphous $SiO_2$ film examined per FIGS. 8A, 8B and 8C for helium ions of various beam energies.

The depth of a depression or dimple in Angstroms in bulk quartz wafers as measured by a mechanical depth gauge is plotted in FIG. 8D as a function of ion energy from 1 to 3 MeV and of ion dose from $10^{14}$ to $10^{17}$ ions/cm² for $^4He^+$ ions. There is a plateau in compaction when the ion dose is greater than approximately $5 \times 10^{15}$ ions/cm².

PRINCIPLES OF THE INVENTION

It is known in the prior art that stored charge can build up with very high ion dose rates both at the surface and within the body of an $SiO_2$ insulator until irreversible catastrophic damage occurs in the insulator. For the practice of this invention, either the dose rates should be kept low enough to avoid build up of stored charge, or incoming positive charge should be neutralized with a simultaneous electron beam.

A density increase of approximately 1% to 5.5% was achieved by ion beam compaction in thermally grown thin $SiO_2$ films. Below the saturation region, the amount of compaction approximately obeyed the relationship $\sim E^{3/4}$. Compaction of thermally grown $SiO_2$ films of thickness in the range of approximately 1000A to 4000A on Si wafers was determined by ellipsometry via changes in refractive index which is an indication of density.

The dielectric breakdown strength property of $SiO_2$ films is improved for the practice of this invention. Although it has been known heretofore that bulk $SiO_2$ could be somewhat densified by sufficient doses of incident ions such as hydrogen and helium, it has not been known either that a thin film $SiO_2$ could be densified by an ion beam or that such densifying would improve the dielectric breakdown strength property thereof. The preferable thickness of a film of $SiO_2$ for the practice of this invention is less than approximately 1 micron and is usually less than approximately 500A for field effect devices, however, thicker films are also envisioned therefor.

A thin layer of thermally grown $SiO_2$ usually has higher density and better dielectric breakdown strength property than a layer of comparable thickness grown by other techniques such as chemical vapor deposition. However, the practice of this invention achieves sufficient densification of a thermally grown film of $SiO_2$ to improve its dielectric breakdown property for practical purpose. Illustratively, the practice of this invention improves the dielectric breakdown strength property of $SiO_2$ films utilized as gate insulator layer for a field effect device or as a passivating layer therefor. Exemplary thickness of the gate electrode insulation layer of $SiO_2$ in a field effect device is preferably less than approximately 500A. Sufficient doses of ions such as hydrogen and helium were known to have densified $SiO_2$ in bulk form. Although H and He ions have been used to irradiate $SiO_2$ film, it has not been discovered heretofore that ion beam densification of a film of amorphous $SiO_2$ would improve any useful dielectric property thereof. Suitable thickness of a film of $SiO_2$ for the practice of this invention is less than approximately 1 micron, i.e., 10,000A.

Particular ions chosen for densifying $SiO_2$ in accordance with the principles of this invention will have energy such that the ions are stopped within the $SiO_2$ layer. It is important that the ions be stopped within the layer to avoid damage to the interface between the $SiO_2$ film and the substrate. Efficiency of densification is also greater if ions are stopped within the layer.

Ion fluence or dose is defined as the number of ions per square centimeter delivered to the $SiO_2$ film over the time interval of the ion bombardment. Saturation fluence for a given ion energy and a given ion species is defined as the number of ions per unit area on target at which no significant further compaction in the $SiO_2$ occurs. That level of compaction is termed saturation compaction.

An ion fluence, i.e., ions per square centimeter, is chosen in the practice of this invention to obtain a significant fraction of the fluence needed for saturation compaction by the given ion and ion-energy involved. The prior art ion implantations into and through film of $SiO_2$ have achieved only a minimal fraction of the saturation compaction. An ion fluence which is of at least 10% of the fluence required for saturation compaction by the given ion and ion energy is desirable for the practice of this invention. The significant fractional fluence for the practice of this invention. The significant fractional fluence for the practice of this invention is preferably more than at least 50% of the fluence for compaction saturation. Foreign atoms should not be incorporated significantly into the $SiO_2$ film if they can be ionized by an energy less than the band-gap of $SiO_2$ film. It is known in the prior art that foreign atoms in $SiO_2$ can reduce its dielectric breakdown strength. In order to avoid incorporation of foreign atoms into the $SiO_2$ during ion implantation for the practice of this invention, it is desirable that it be accomplished directly into the $SiO_2$ and not through an intermediate layer. If the ion implantation is via intermediate layer, ions thereof may be knocked forward into the $SiO_2$ layer where they form a contamination which reduces the dielectric strength of the $SiO_2$.

A superimposed metallic surface layer may contribute knock-on atoms which are detrimental to the dielectric properties of the $SiO_2$ layer. It is important for the practice of this invention that the ions not be implanted into the $SiO_2$ layer through such a metallic surface layer.

A layer on the surface of the $SiO_2$ during irradiation proves beneficial under certain special circumstances for the practice of this invention. Such surface film should comprise a material with an ionization energy greater than approximately 5 electron-volts, which is the ionization energy of $SiO_2$. The knock-on of these atoms into the $SiO_2$ layer will not degrade its dielectric breakdown strength property because the ionization energy for such ions is large relative to the bandgap of $SiO_2$. Available ions for the practice of this invention include hydrogen, argon, xenon, krypton, neon and helium.

THEORY AND PRACTICE OF THE INVENTION

Implantation ion fluences imparted to $SiO_2$ in film form were substantially less in the prior art than ion fluences for the practice of this invention. Ions introduced into a layer of $SiO_2$ by other techniques, including diffusion from a plasma adjacent to the surface, cannot be introduced into the layer with sufficient energy to accomplish compaction to a significant depth below the surface. The highest electric field which $SiO_2$ will support is approximately 0.1 volt per angstrom, and an ion introduced into this field will tend to be accelerated. Because the ion will also lose energy by impact with the $SiO_2$ lattice at a rate greater than 0.1 volt per angstrom, an ion will necessarily be decelerated therein. Internal electric fields in the $SiO_2$ cannot be used to achieve significant compaction. Therefore, ions must enter the $SiO_2$ with sufficient energy to accomplish significant compaction.

Compaction of $SiO_2$ by an electron beam is not contemplated for the practice of this invention. Electron beam compaction of $SiO_2$ is distinguished technically from compaction by ions of hydrogen and helium for the practice of this invention. Theoretically, there are two physical aspects of compaction of $SiO_2$, or other similar glass material, which involve momentum transfer thereto by atomic collision and by atomic ionization. Electron beams, gamma rays and x-rays are known in the prior art to compact glass only by atomic ionization which is several orders of magnitude, i.e., multiples of 10, smaller than compaction by atomic collisions. Therefore, compaction of films of $SiO_2$ and the like by ions is so much more effective than by electron beams, x-rays or gamma rays as to make them unacceptable for practice of this invention. It is also considered likely that only the kind of compaction produced by ion collision is effective in the practice of this invention. Although compaction of bulk $SiO_2$ can be achieved by neutrons, the neutron range can never be sufficiently well-defined to satisfy the ion range requirement of this invention. Therefore, a neutron flux is not suitable to use for compaction of an insulator layer of an electrical device. Illustratively, in silicon semiconductor device fabrication, incident neutrons go through the very thin $SiO_2$ film into the underlying silicon semiconductor which damages the interface and degrades the performance of this device.

Densification by incident ions of amorphous $SiO_2$ in bulk form structure has been both observed and explained in the prior art. Several mechanisms have been proposed for the noted compaction of bulk $SiO_2$. It has been proposed that it is the knock-on of the silicon or oxygen atoms to interstitial sites which establishes a more dense structure. It has also been proposed that it is the conversion of one form of the silica molecular structure to another wherein the angle between adjacent silicon-oxygen-silicon bonds is increased with consequent increase in the density of the structure. It has also been proposed that it is the collapse of the micropores in the $SiO_2$ which establishes a denser structure.

It is theorized herefor that the observed increase in density of $SiO_2$ film through ion beam compaction in accordance with the principles of this invention is mainly due to collapse of micropores in the amorphous structure of the film. Accordingly, it is further theorized herefor that the increase in dielectric breakdown strength of the ion implanted $SiO_2$ film is a direct consequence of the increase in density of the film. The films are microporous in nature. This porosity was reduced by the implantation of ions of suitable energy into the exemplary $SiO_2$ films. The total densification of each of these examples by ion implantation was approximately 4% in volume. Another exemplary 200A thick film of $SiO_2$ was grown on a silicon substrate by thermal oxidation of the silicon surface and was thereafter both densified and annealed. It was discovered for the practice of this invention through such exemplary considerations that both densifying and annealing $SiO_2$ films accomplished the following two practically important results: (1) an increase in the average dielectric breakdown strength of the films; and (2) a reduction in the number of examples which break down at a given voltage which is much smaller for portions of the same films than the intrinsic breakdown voltage without the densifying and annealing treatments in accordance with the principles of this invention; and (3) densification by ion implantaton causes an increase of the dielectric breakdown strength to a value approximating the theoretical value for a homogeneous insulator.

What is claimed is:

1. Method for increasing the dielectric breakdown strength of an amorphous $SiO_2$ film with thickness less than approximately 1 micron of a device in an electric field supporting path of said device comprising steps of:
   fabricating said device in a portion thereof including fabricating said film,
   irradiating said film with ions selected from the group comprising hydrogen, helium, argon, krypton, neon and xenon, and being of sufficient fluence and energy to densify said film by at least 50 percent of saturation compaction as averaged over the range of said ions in said film and being of insufficient energy to penetrate completely through said film, and
   annealing said film with a combination of time and temperature to remove substantially electric charge introduced therein by said energetic ions,
   whereby the dielectric breakdown strength of said film is increased.

2. Method as set forth in claim 1 wherein said temperature is in the range between 200° C and 800° C.

3. Method as set forth in claim 1 wherein said steps of fabricating said layer, irradiating said layer and annealing said layer are concurrent.

4. Method as set forth in claim 1 wherein said ions are hydrogen and said fluence is at least approximately $3.4 \times 10^{16}$ ions/cm².

5. Method as set forth in claim 1 wherein said ions are helium and said fluence is at least approximately $1.5 \times 10^{15}$ ions/cm².

6. Method as set forth in claim 1 wherein said ions are argon and said fluence is at least approximately $1.8 \times 10^{13}$ ions/cm².

7. Method for increasing the dielectric breakdown strength of an insulating-glassy material film with thickness less than approximately 1 micron of a device in an electric field supporting path of said device comprising steps of:
   fabricating said device in a portion thereof including fabricating said film,
   irradiating said film with ions selected from the group comprising hydrogen, helium, argon, krypton, neon and xenon, and being of sufficient fluence and energy to densify said film by at least 50 percent of saturation compaction as averaged over the range of said ions in said film and being of insufficient energy to penetrate completely through said film, and
   annealing said film with a combination of time and temperature to remove substantially electric charge introduced therein by said energetic ions.
   whereby the dielectric breakdown strength of said film is increased.

* * * * *